(12) United States Patent
Huang et al.

(10) Patent No.: US 11,271,597 B1
(45) Date of Patent: Mar. 8, 2022

(54) WIDEBAND TRANSMITTER FOR MILLIMETER-WAVE WIRELESS COMMUNICATION

(71) Applicant: SWIFTLINK TECHNOLOGIES CO., LTD., Suzhou (CN)

(72) Inventors: Min-Yu Huang, Richmond (CA); Thomas Chen, Richmond (CA)

(73) Assignee: SWIFTLINK TECHNOLOGIES CO., LTD., Suzhou (CN)

( * ) Notice: Subject to any disclaimer, the term of this patent is extended or adjusted under 35 U.S.C. 154(b) by 0 days.

(21) Appl. No.: 17/021,017

(22) Filed: Sep. 15, 2020

(51) Int. Cl.
*H04B 1/04* (2006.01)
*H03H 7/21* (2006.01)
*H03H 11/22* (2006.01)
*H03H 11/04* (2006.01)

(52) U.S. Cl.
CPC ............... *H04B 1/04* (2013.01); *H03H 7/21* (2013.01); *H03H 11/22* (2013.01); *H03H 2011/0494* (2013.01); *H04B 2001/045* (2013.01); *H04B 2001/0416* (2013.01)

(58) Field of Classification Search
CPC ...... H04B 1/40; H04B 2001/045; H03H 7/21; H03H 11/22; H03H 2011/0494
USPC ................. 375/262, 295–298, 350
See application file for complete search history.

(56) References Cited

U.S. PATENT DOCUMENTS

| | | | | |
|---|---|---|---|---|
| 8,121,577 B1* | 2/2012 | McKay | ........... | H04B 1/109 455/326 |
| 9,960,883 B1* | 5/2018 | Chakraborty | ........ | H03D 7/1458 |
| 2009/0245420 A1* | 10/2009 | Hausmann | ........... | H04L 27/362 375/298 |
| 2010/0022196 A1* | 1/2010 | Derouet | ............... | H04B 1/0475 455/75 |
| 2011/0092169 A1* | 4/2011 | Savoj | ...................... | H03H 7/21 455/73 |
| 2013/0120190 A1* | 5/2013 | McCune, Jr. | ............ | H01Q 3/42 342/368 |

(Continued)

*Primary Examiner* — Emmanuel Bayard
(74) *Attorney, Agent, or Firm* — Womble Bond Dickinson (US) LLP

(57) ABSTRACT

There is provided wireless transmitter that includes a poly phase filter (PPF) configured to receive an input differential intermediate frequency (IF) signal and to generate an in-phase differential IF signal and a quadrature differential IF signal. The wireless transmitter further includes a transformer-based circuit configured to receive an input differential local oscillator (LO) signal and to generate an in-phase differential LO signal and a quadrature differential LO signal based on the input differential LO signal. In addition, the wireless transmitter includes a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component, the mixer further configured to provide a differential RF signal comprising a (filtered or unfiltered) combination of the first RF signal component and the second RF signal component. Furthermore, the wireless transmitter includes an amplification stage configured to amplify the differential RF signal, the amplification stage comprising a driver stage and a power amplifier stage.

18 Claims, 13 Drawing Sheets

(56) References Cited

U.S. PATENT DOCUMENTS

2014/0376683 A1* 12/2014 Goldblatt ............... H03K 21/17
377/121
2018/0375711 A1* 12/2018 Mao ....................... H03D 3/009
2020/0067497 A1* 2/2020 Frounchi ................ H03B 27/00
2020/0106413 A1* 4/2020 Davis ...................... H03H 7/21

* cited by examiner

WIDEBAND TRANSMITTER FOR MILLIMETER-WAVE WIRELESS COMMUNICATION

FIELD

Embodiments of the present invention relate generally to wireless communication system. More particularly, embodiments of the invention relate to a wideband transmitter of a communication system.

BACKGROUND

Fifth generation (5G) communication promises a substantial (potentially ten to one hundred times) increase in data-rates, which can radically change the future of wireless connectivity and applications. In response to increased data-rates, millimeter-wave (mm-wave) bands can potentially deliver extreme data rates and higher capacity compared to low-GHz bands. Accordingly, with the shift toward millimeter-wave (mm-Wave) frequencies there is a need to support the fast and dynamic future of electromagnetic application scenarios. However, facilitating faster data rates poses further challenges associated with broader bandwidth. For example, the 3GPP 5G NR standard specifies stringent functionalities on future networks for covering wide band-width including 24, 28, 37, 39, 43 and 46 GHz bands.

Wideband poses further design challenges for a transmitter associated therewith. For example, obtaining adequate image rejection with on-chip circuits can be difficult due to wideband in-phase quadrature (IQ) generations, especially at mm-Wave frequencies. Moreover, since broadband transmitters normally operate at high output power, their output signals may include both the desired signals and their image signals (as the signal paths or the local oscillator (LO) paths are imbalanced); thereby introducing interference signals which can jam the corresponding receiver via the output image signal.

Therefore, there is a need for a wideband transmitter and method thereof that obviates or mitigates one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

In accordance with embodiments of the present invention, there is provided a wireless transmitter. The wireless transmitter includes a poly phase filter (PPF) configured to receive an input differential intermediate frequency (IF) signal and to generate an in-phase differential IF signal and a quadrature differential IF signal. The wireless transmitter further includes a transformer-based circuit configured to receive an input differential local oscillator (LO) signal and to generate an in-phase differential LO signal and a quadrature differential LO signal based on the input differential LO signal. The wireless transmitter further includes a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component, the mixer further configured to provide a differential RF signal including a (filtered or unfiltered) combination of the first RF signal component and the second RF signal component. The wireless transmitter further includes an amplification stage configured to amplify the differential RF signal, the amplification stage including a driver stage and a power amplifier stage. In some embodiments, the PPF includes a resistive-capacitive capacitive resistive network. In some embodiments, the PPF includes a first stage and a second stage. In some embodiments, the first stage includes a first pair of inputs and a first pair of branches, wherein each of the first pair of branches includes, in series: a first capacitor, a first resistor, a second capacitor and a second resistor, and wherein each of the first pair of branches is coupled at its ends to the first pair of inputs. In some embodiments, the first stage further includes a first pair of outputs provided at a junction between the first capacitors and the first resistors. In some embodiments, the first stage further includes a second pair of outputs provided at a junction between the second capacitors and the second resistors. In some embodiments, the second stage includes a second pair of inputs and a second pair of branches, wherein each of the second pair of branches includes, in series: a first further capacitor, a first further resistor, a second further capacitor and a second further resistor, and wherein each of the second pair of branches is coupled at its ends to the second pair of inputs. In some embodiments, the second stage further includes a third pair of inputs provided at a junction between the first further resistors and the second further capacitors. In some embodiments, the second stage further includes a third pair of outputs provided at a junction between the first further capacitors and the first further resistors. In some embodiments, the second stage further includes a fourth pair of outputs provided at a junction between the second further capacitors and the second further resistors. In some embodiments, the first pair of outputs is coupled to the third pair of inputs, and the second pair of outputs is coupled to the second pair of inputs. In some embodiments, the PPF and the transformer-based circuit are cooperatively configured to facilitate wideband image rejection by configuring the PPF to generate the in-phase differential IF signal and the quadrature differential IF signal to have matched amplitude characteristics and orthogonal phase characteristics over a wide frequency band. In some embodiments, the PPF and the transformer-based circuit are cooperatively configured to facilitate wideband image rejection by further configuring the transformer-based circuit to generate the in-phase differential LO signal and the quadrature differential LO signal to have matched amplitude characteristics and orthogonal phase characteristics over said wide frequency band. In some embodiments, the mixer is further configured to facilitate wideband image rejection by providing a high input impedance to support the PPF and the transformer-based circuit in providing outputs having matched amplitude characteristics and orthogonal phase characteristics over said wide frequency band. In some embodiments, the transformer-based circuit includes a first stage and a second stage, the first stage including a first instance of a transformer circuit receiving the differential input LO signal, the second stage including a second instance and a third instance of the transformer circuit, wherein output of the first stage is provided to the second stage, and wherein the second instance and the third instance are cross-coupled and configured to provide the in-phase differential LO signal and the quadrature differential LO signal. In some embodiments, each instance of the transformer circuit includes a pair of transformers each having four ports, with one of the four ports being grounded through a resistor, and each other one of the four ports being coupled to an input of the transformer-based circuit, an output of the transformer-based circuit, or another port of another instance of the transformer circuit. In some embodiments, the transformer-based circuit is provided using plural layers of electrical traces arranged in concentric spirals. In some embodiments, the transformer-based circuit is configured to provide a passive voltage gain. In some embodiments, the transformer-based circuit is configured to facilitate wideband image rejection by generating the in-phase differential LO signal and the quadrature differential LO signal to have matched amplitude characteristics and orthogonal phase characteristics over a wide frequency band. In some embodiments, the first stage and the second stage of the transformer-based circuit are cascaded to suppress mismatch in one or both of: amplitude characteristics; and non-orthogonality in phase characteristics, of the in-phase differential LO signal and the quadrature differential LO signal. In some embodiments, at least one electrical connection between instances of the transformer circuit is configured to provide a capacitance which, together with a capacitance of one or more of said instances of the transformer circuit, provides for a desired capacitance in the transformer-based circuit. In some embodiments, the transformer-based circuit is configured to have capacitance and impedance characteristics which operate, through resonance, to mitigate one or more parasitic capacitances produced by one or more transistors present in the mixer. In some embodiments, the mixer includes a first mixer portion configured to multiplicatively mix the in-phase differential IF signal with the quadrature differential LO signal to produce the first RF signal component and a second mixer portion operating in parallel with the first mixer portion and configured to multiplicatively mix the quadrature differential IF signal with the in-phase differential LO signal to produce the second RF signal component, and wherein each of the first mixer portion and the second mixer portion includes a set of transistors arranged in a source-to-drain configuration with gates of the transistors configured to receive the in-phase differential IF signal, the quadrature differential LO signal, the quadrature differential IF signal, and the in-phase differential LO signal, respectively. In some embodiments the driver stage includes a common source amplifier. In some embodiments, the power amplifier stage includes a cascade amplifier. In some embodiments, the driver stage includes a first set of neutralization capacitors each having a first capacitance, and the power amplifier stage includes a second set of neutralization capacitors having a second capacitance which is three times the first capacitance, and wherein the driver stage includes a first set of transistors having a first gate width, and the power amplifier stage includes a second set of transistors having a second gate width which is three times the first gate width. In some embodiments, the wireless transmitter further includes one or more of: a first transformer circuit interposed between an output of the mixer and an input of the driver stage; a second transformer circuit interposed between an output of the driver stage and an input of the power amplifier stage; and a third transformer circuit interposed between an output of the power amplifier stage and a subsequent antenna stage. In some embodiments, the mixer includes an output load inductor which is cooperatively configured with input capacitances of the one or both of the driver stage and the power amplifier stage to form one or more band pass filters, said band pass filters configured to suppress harmonic signals from the mixer.

Embodiments have been described above in conjunctions with aspects of the present invention upon which they can be implemented. Those skilled in the art will appreciate that embodiments may be implemented in conjunction with the aspect with which they are described, but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

BRIEF DESCRIPTION OF THE FIGURES

Further features and advantages of the present invention will become apparent from the following detailed description, taken in combination with the appended drawings.

FIG. 10 illustrates a schematic diagram of the mm-Wave wideband image-reject transmitter, according to embodiments.

It will be noted that throughout the appended drawings, like features are identified by like reference numerals.

DETAILED DESCRIPTION

Figure 1A:
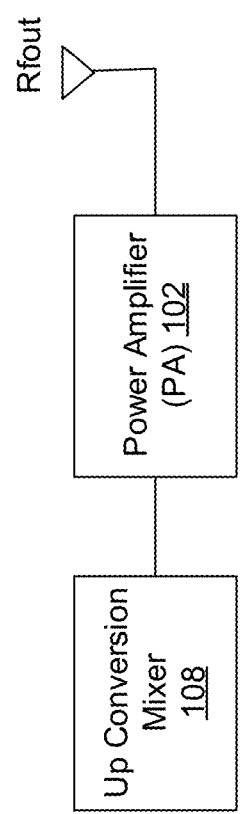
FIG. 1A illustrates a block diagram of the basic components of a mm-Wave wideband image-reject transmitter, according to embodiments.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present invention.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, etc., may be used without departing from the scope of the disclosure.

FIG. 1A illustrates a block diagram of the basic components of a proposed mm-Wave wideband image-reject transmitter, according to embodiments. The mm-Wave wideband image-reject transmitter 100, or simply transmitter 100, comprises at least a power amplifier 102 coupled to an up-conversion mixer 108. The coupling between the components, the power amplifier (PA) 102 and the up-conversion mixer 108, are further described herein with reference to other embodiments. The up-conversion mixer converts an intermediate frequency (IF) signal to a radio frequency (RF) signal by multiplicative mixing. The power amplifier is used to feed the RF signal to a transmitting antenna or antenna array.

According to various embodiments of the present invention, there is provided a wireless transmitter. The wireless transmitter includes at least a poly phase filter (PPF) configured to receive an input differential intermediate frequency (IF) signal and to generate an in-phase differential IF signal and a quadrature differential IF signal. The wireless transmitter further includes a transformer-based circuit configured to receive an input differential local oscillator (LO) signal and to generate an in-phase differential LO signal and a quadrature differential LO signal based on the input differential LO signal. In addition, the wireless transmitter includes a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component. The mixer is further configured to provide a differential RF signal comprising a (filtered or unfiltered) combination of the first RF signal component and the second RF signal component. Furthermore, the wireless transmitter includes an amplification stage configured to amplify the differential RF signal, the amplification stage comprising a driver stage and a power amplifier stage.

The transmitter includes various desirable features, due to features of individual components as well as due to interaction and co-design of different components. Overall, the transmitter may have a relatively high image rejection performance and wideband operating characteristic. Generation of the in-phase and the quadrature local oscillator signals may be performed using a multi-stage transformer circuit, which provides a passive gain which interoperates in a desirable manner with the mixer circuitry. The mixer is also fed IF signals via a poly-phase filter, which produces in-phase and quadrature IF signals from the input IF signal and also cooperates with the mixer circuit to facilitate image rejection. The mixer circuit has high input impedance via use transistor gates to receive input signals.

Figure 1B:
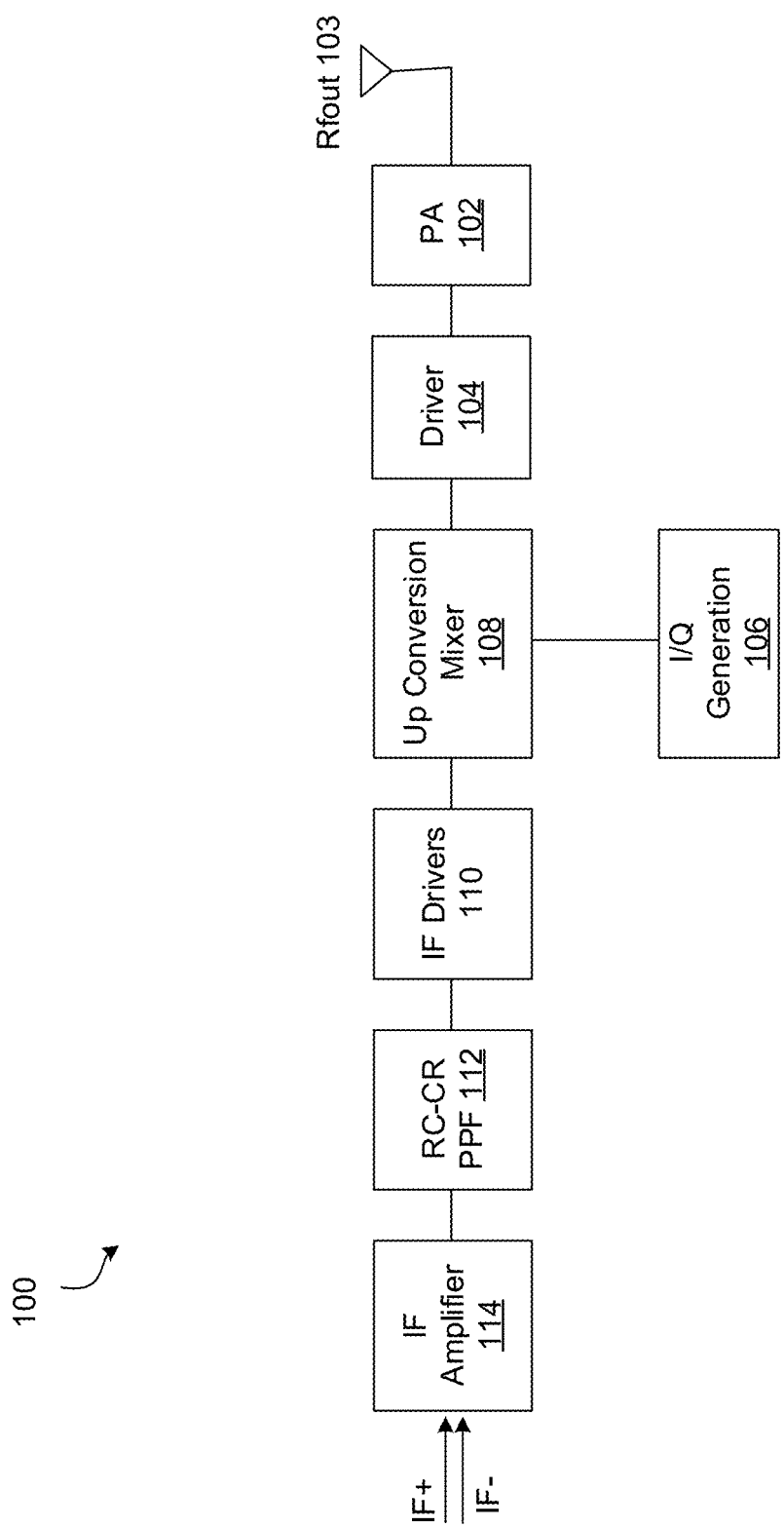
FIG. 1B illustrates a block diagram illustrating a transmitter circuit, according to embodiments.
Figure 1C:
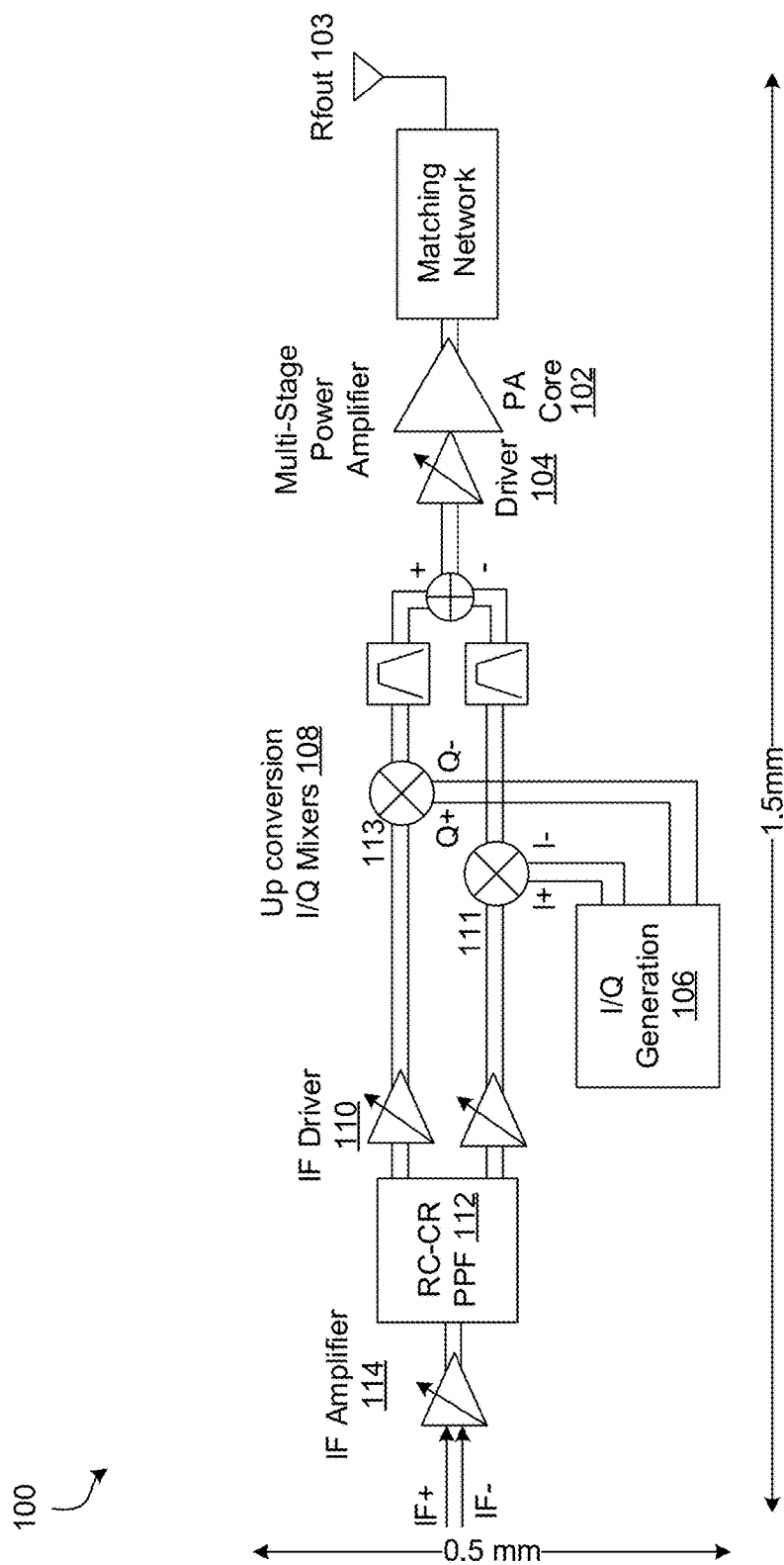

FIG. 1B illustrates a block diagram illustrating a transmitter circuit, according to embodiments. The transmitter 100 comprises a plurality of components as illustrated. The transmitter 100 may receive intermediate frequency (IF) signals IF+ and IF− at an IF amplifier 114 for amplifying the IF signals. The IF amplifier 114 can be coupled to an RC-CR poly-phase filter (PPF) 112 which is in turn coupled to an IF driver 110. The IF driver 110 and the IQ generation 106 are both coupled to the up-conversion mixer 108. The Up-conversion mixer 108 is coupled to the driver which is coupled to the PA 102. The PA 102 is further coupled to an antenna 103 for transmitting a signal within one or more frequency bands or a broad range of frequencies. The couplings between the different components of the transmitter 100 are further described herein with reference to other embodiments.

FIG. 10 illustrates a schematic diagram of the mm-Wave wideband image-reject transmitter, according to embodiments. Referring to FIG. 10 (and as described with reference to FIG. 1B), the transmitter 100 comprises a broadband mm-Wave power amplifier 102, a driver 104, an ultra-wideband low-loss IQ LO generation 106, compact high up-conversion-gain mixers 108, and variable gain IF amplifiers 110 with two-stage RC-CR poly-phase filter (PPF) 112.

Figure 2A:
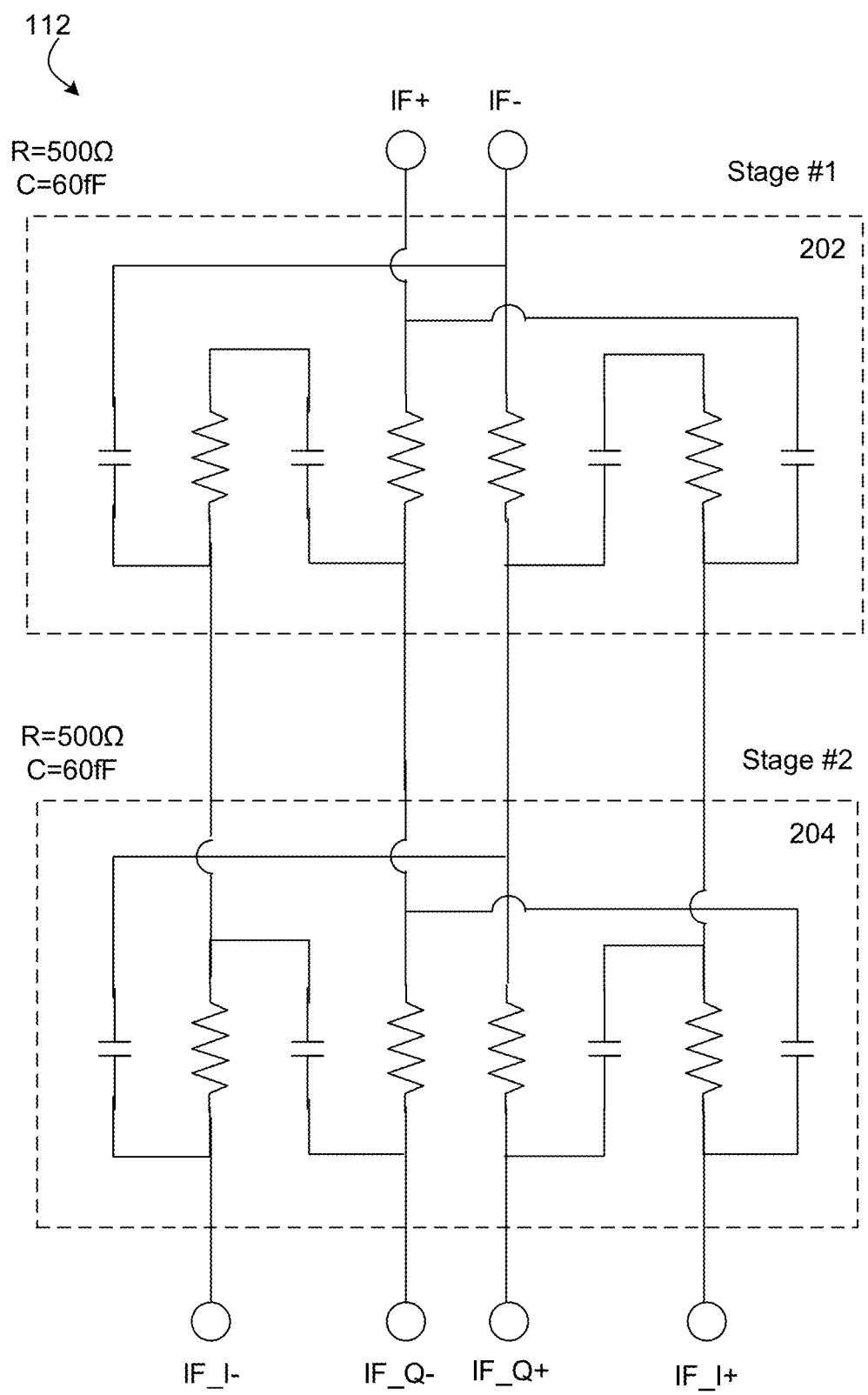
FIG. 2A illustrates a schematic diagram of a 2-stage resistive-capacitive capacitive-resistive (RC-CR) poly phase filter (PPF), according to embodiments.

The PPF 112 is a is a resistive-capacitive capacitive-resistive poly phase filter, which may be configured to filter out higher frequency noise and convert a differential IF signal to differential in-phase IF signals (IF_I+ and IF_I−) and differential quadrature IF signals (IF_Q+ and IF_Q−) based on the received differential IF frequency as further discussed herein and illustrated in FIG. 2A.

Figure 3A:
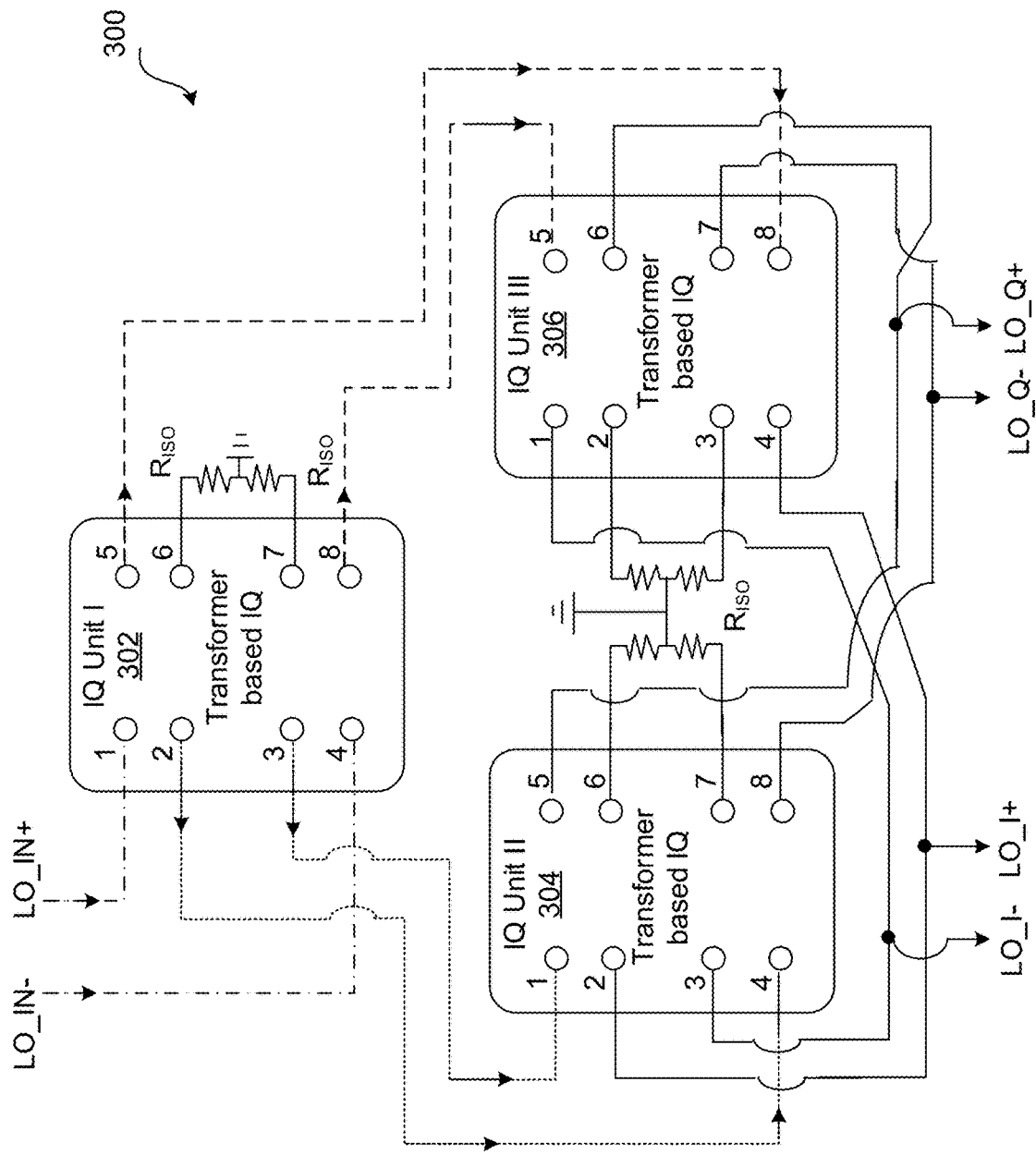
FIG. 3A illustrates 2-stage mm-Wave wideband IQ LO generation, according to embodiments.

The transformer-based IQ generator 106 may be configured to generate differential in-phase local oscillator signal (LO_I+ and LO_I−) and a differential local oscillator quadrature signals (LO_Q+, and LO_Q−) based on a local oscillator (LO) signal (e.g., LO_IN+ and LO_IN−) received from a LO within the IQ generation network 300 (FIG. 3A). LO_I+ and LO_I− may represent a differential in-phase signal and LO_Q+ and LO_Q− may represent a differential quadrature signal. LO_IN+ and LO_IN− may represent a differential LO input signal to transformer-based IQ generator 106.

Figure 4:
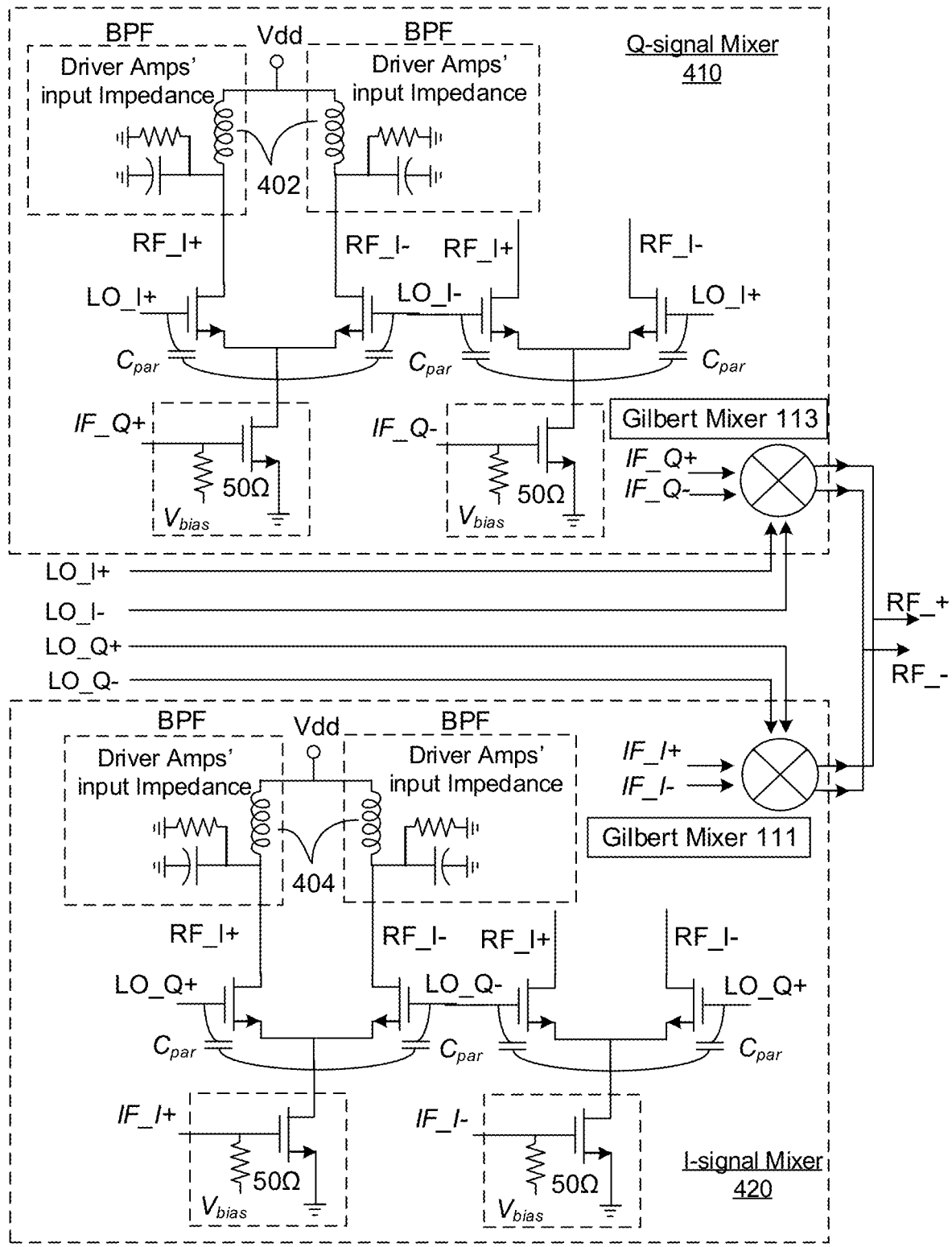
FIG. 4 illustrates a schematic of the double balanced differential IQ up-conversion mixer, according to embodiments.

The high up-conversion-gain mixers 108, may comprise an up-converter having one or more mixers 111 and 113 coupled to the pair of IF drivers 110 and the transformer-based IQ generator 106 for receiving and mixing: amplified IF signals (from the IF drivers) and the differential LO_I and LO_Q signals from the I/O generation 106. The in-phase IF signals (IF_I+ and IF_I−) from the IF drivers 110 may be fed to the mixer 111 to be mixed with the differential local oscillator quadrature signals (LO_Q+, and LO_Q−) (as illustrated in FIG. 4). Similarly, the differential quadrature IF signals (IF_Q+ and IF_Q−) from the IF drivers 110 may be fed to the mixer 113 to be mixed with the differential in-phase local oscillator signal (LO_I+ and LO_I−) (as illustrated in FIG. 4. The up-converter may further be configured to up-convert the IF signals to millimeter (mm) wave frequency signals.

According to embodiments, "P1 dB" may refer to specification for determining a power amplifier performance, for example, P1 dB may indicate an Out Power of 1 dB compression point from the power amplifier. The P1 dB bandwidth of the transmitter 100 may range from 24 GHz to 43 GHz with an output power range of 18.5 to 20 dBm. The conversion gain of the transmitter 100 in some embodiments may be greater than 26 dB with an instantaneous imaging rejection ratio of greater than 30 dB, which may be considered as outperforming state-of-the-art mm-Wave transmitters in silicon. The transmitter 100 can provide enhanced mobile broadband bandwidths for AR/VR, a high-speed MIMO transceiver system and a mm-Wave multi-spectrum data link realization.

Embodiments will now describe IF IQ and broadband mm-Wave LO Generation.

In an embodiment, for example referring to FIG. 10, before up conversion at the IQ double balanced mixers 108, the mixers 108 are fed by the wideband IF variable-gain amplifier (VGA) 114 and IF RC-CR PPF 112, so that image signals can be rejected after the conversion. The IF differential VGA 114 may comprise a differential pair with 3-bit PMOS bank as resistive load to realize gain controls. Next, the two-stage RC-CR PPF 112 is utilized to complete the IR at the IF frequency as illustrated in FIG. 2A.

FIG. 2A illustrates a schematic diagram of the 2-stage RC-CR PPF 112, according to embodiments. The 2-stage RC-CR PPF 112 may comprise a first stage 202 and a second stage 204 as illustrated in FIG. 2A. Each resistor in the first stage 202 and the second stage 204 may have a resistance of 500 ohms (Ω). Each capacitor in the first stage 202 and the second stage 204 may have a capacitance of 60 femtofarad (fF). The resistive-capacitive capacitive-resistive PPF includes a first stage and a second stage, which are each resistor capacitor networks and which are substantially identical, except for input/output configuration. The first stage has two inputs and four outputs, and the second stage has four inputs and four outputs, with the four outputs of the first stage fed to the four inputs of the second stage.

The first stage 202 has two branches. Each branch is coupled at a first input terminal to one of the inputs (IF+ or IF−) and at a second input terminal to another of the inputs (IF− or IF+), where the inputs provide the differential IF input signal. Each branch includes, in series: a first capacitor, a first resistor, a second capacitor, and a second resistor. Each branch has a first output terminal coupled to the junction between the first capacitor and the first resistor, and a second output terminal coupled to the junction between the second capacitor and the second resistor.

The second stage 204 is identical to the first stage, except that a third input terminal and a fourth input terminal are provided. The third input terminal is coupled to the junction between the first resistor and the second capacitor of the first branch (or alternatively between the second resistor and the first capacitor of the first branch). The fourth input terminal is coupled to the junction between the first resistor and the second capacitor of the second branch (or alternatively between the second resistor and the first capacitor of the second branch).

Figure 2B:
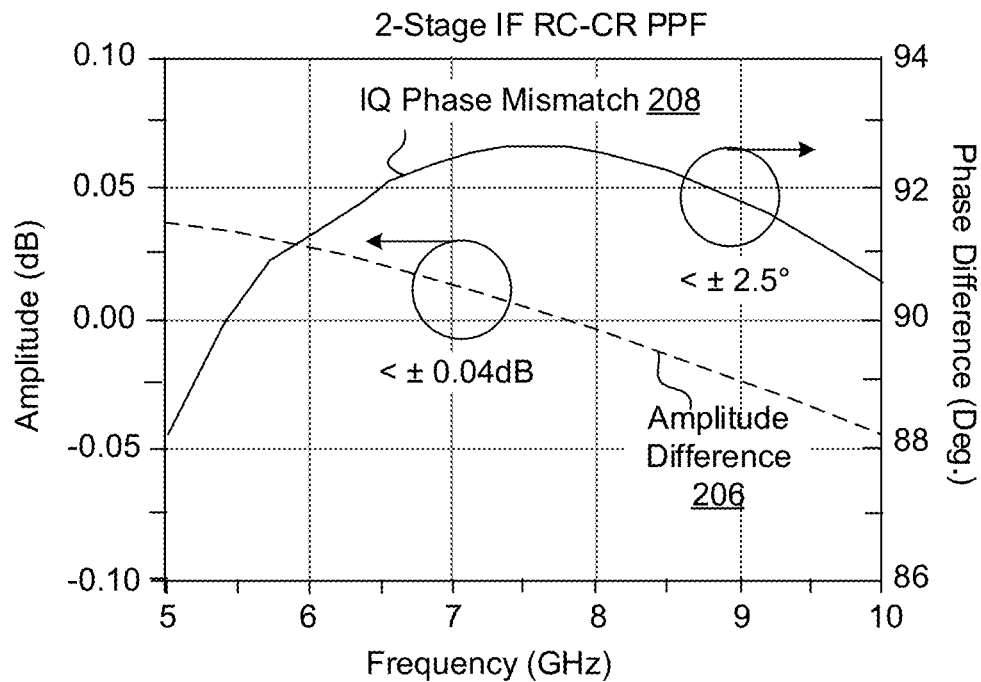
FIG. 2B illustrates a simulated amplitude mismatch and phase difference of the 2-stage RC-CR PFF, according to embodiments.
Figure 2C:
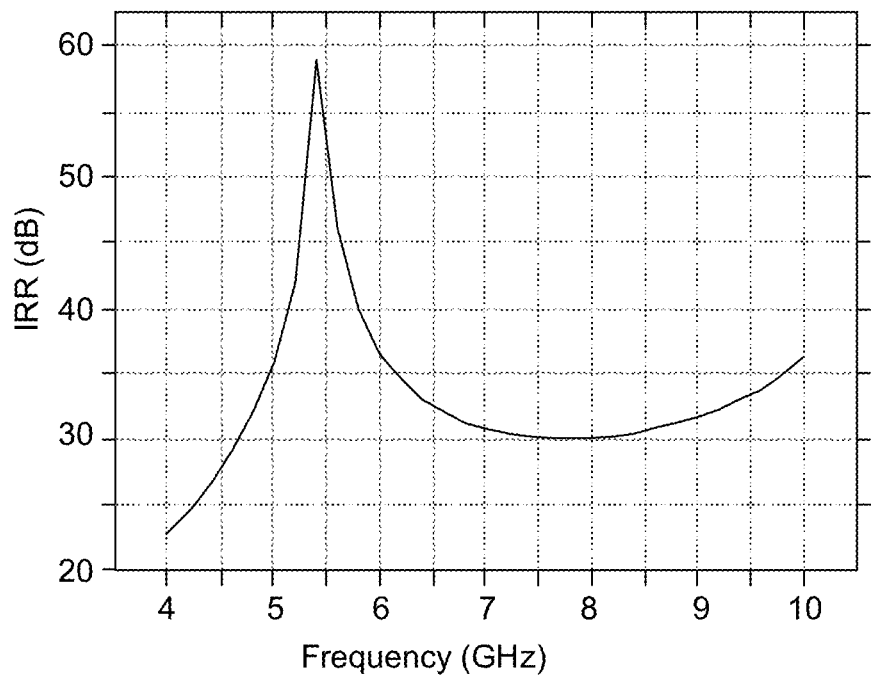
FIG. 2C illustrates an image rejection ratio (IRR) of the 2-stage RC-CR PFF, according to embodiments.

FIG. 2B illustrates the simulated amplitude mismatch 206 and phase difference 208 of the 2-stage RC-CR PFF 112, according to embodiments. FIG. 2C illustrates the image rejection ration (IRR) of the 2-stage RC-CR PFF 112, according to embodiments. Referring to FIG. 2B and FIG. 2C, the RC-CR PPF 112 may provide for a simulated IQ amplitude imbalance of less than ±0.043 dB and IQ phase mismatch of less than ±2.5° with an intrinsic IRR range of 30-58.8 dB over a wide IF bandwidth of 5-10 GHz, which may support multi-Gb/s 5G communication.

In some embodiments, to extend wideband operation for the mm-Wave image-reject transmitter 100, a robust low-cost mm-Wave transformer-based IQ network (for IQ Generation 106) is configured to convert one differential LO input to two balanced well-matched differential IQ LO outputs (which are fed to the up conversion mixers 108). The multi-staging operates to buffer the input and output from each other. This significantly reduces the impact that loading on the output has on the input, thus providing for a buffering effect.

Figure 3C:
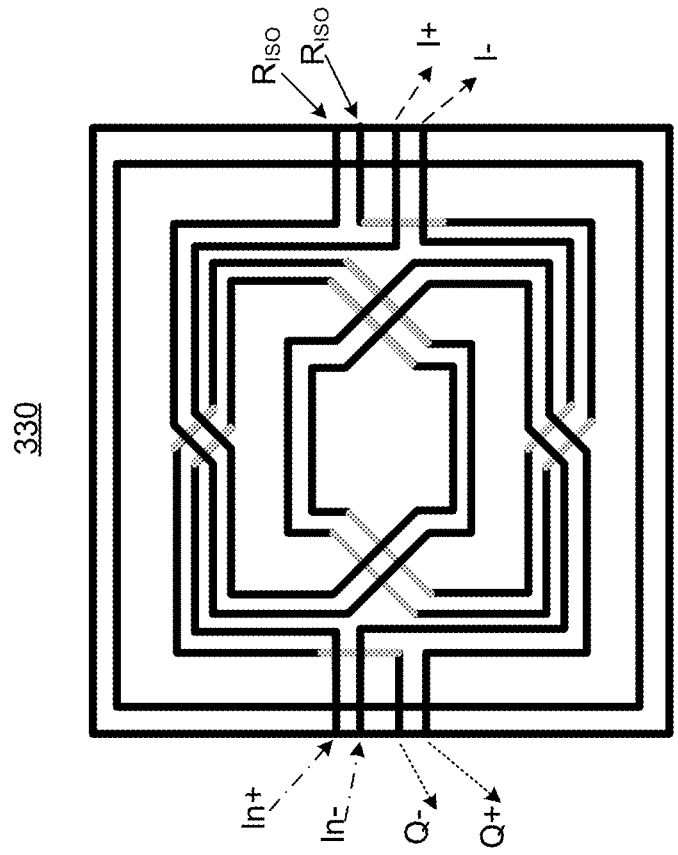
FIG. 3C illustrates a high frequency structure simulator (HFSS) structure of the transformer-based IQ example, according to embodiments.

FIG. 3A illustrates a 2-stage mm-Wave wideband IQ LO generation, according to embodiments. In some embodiments, the transformer-based IQ network 300 with compact size and low loss is designed based on a 2-stage cascaded self-similar 90-degree hybrid coupler as a one-inductor-footprint IQ transformer as illustrated in FIG. 3A. The first stage of the cascade IQ network 300 may comprise IQ Unit I 302, which receives the signals LO_IN− and LO_IN+ at ports 1 and 4 of the IQ Unit 1 302. The second stage of the cascade IQ network 300 may comprise IQ Unit II 304 and IQ Unit III 306, which receives the outputs of the IQ Unit I 302. The second stage of the cascade IQ network (IQ Unit II 304 and IQ Unit III 306) may produce outputs LO_I−, LO_I+, LO_Q−, and LO_Q+ as illustrated. A person skilled in the art can appreciate that the transformer-based IQ network of FIG. 3A illustrates a generic form for wideband IQ generation. Accordingly, the transformer-based IQ could be any LC-based lumped circuit or traces in one inductor footprint, for example, as illustrated in FIG. 3B and FIG. 3C.

Figure 3B:
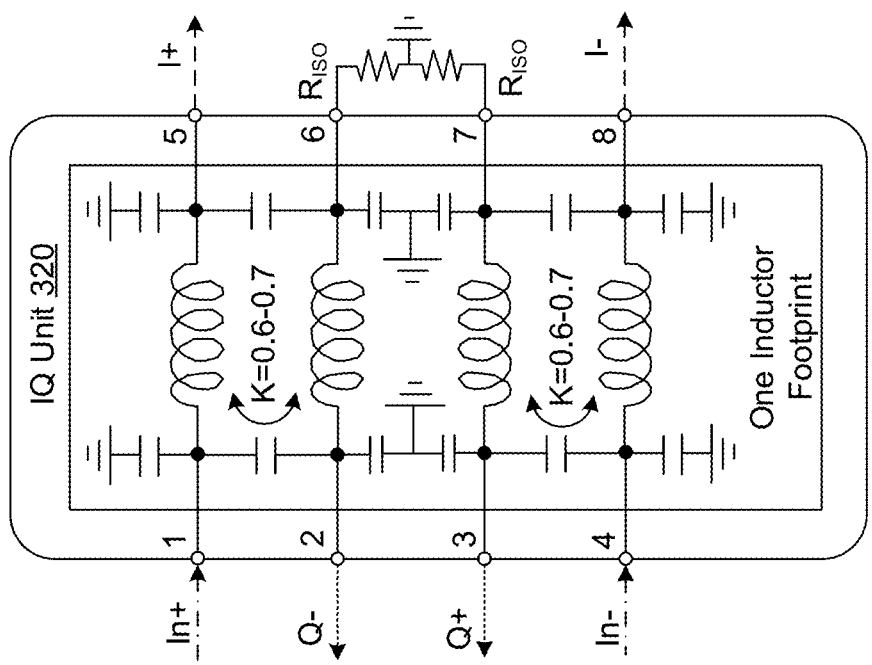
FIG. 3B illustrates a transformer-based IQ unit, according to embodiments.

FIG. 3B illustrates a transformer-based IQ unit, according to embodiments. The IQ unit 320 may be similar to the IQ Unit I 302. As illustrated, the IQ unit 320 may receive inputs In+ and In− at ports 1 and 4, and produce outputs I+ and I− signals at ports 5 and 8 respectively, and output signals Q− and Q+ at ports 2 and 3 respectively.

The IQ unit includes two in-phase first ports 1 and 4, two in-phase second ports 5 and 8, two quadrature first ports 2 and 3, and two quadrature second ports 6 and 7. The in-phase first port 1 is coupled to the in-phase second port 5 through a first winding of a first transformer. The in-phase first port 4 is coupled to the in-phase second port 8 through a first winding of a second transformer. The quadrature first port 2 is coupled to the quadrature second port 6 via a second winding of the first transformer, which is coupled to the first winding of the first transformer. The quadrature first port 3 is coupled to the quadrature second port 7 via a second winding of the second transformer, which is coupled to the first winding of the second transformer.

The in-phase first ports, the in-phase second ports, the quadrature first ports, and the quadrature second ports are each capacitively coupled to ground. The in-phase first ports are capacitively coupled to the quadrature first ports, and the in-phase second ports are capacitively coupled to the quadrature second ports.

Referring again to FIG. 3A, in IQ Units I and II, the quadrature second ports are coupled to ground via respective resistors. Similarly, in IQ Unit III, the quadrature first ports are coupled to ground by respective resistors. As illustrated, the in-phase first ports of IQ Unit I receive a differential LO input signal, which may be a sinusoidal signal for example. The in-phase second ports of IQ Unit I are coupled to the in-phase second ports of IQ Unit III. The quadrature first ports of IQ Unit I are coupled to the in-phase first ports of IQ Unit II.

IQ Units II and III are cross-coupled and cooperatively provide differential LO in-phase and quadrature outputs as follows. The quadrature first ports of IQ Unit II are coupled to the in-phase first ports of IQ Unit III and also provide the differential LO in-phase outputs. The in-phase second ports of IQ Unit II are coupled to the quadrature second ports of IQ Unit III and also provide the differential LO quadrature outputs.

The IQ generation network 300 may be referred to a transformer-based circuit and each of the IQ unit I, II and III may be referred to an instance of a transformer circuit. In some embodiments, at least one electrical connection between instances of the transformer circuit is configured to provide a capacitance which, together with a capacitance of one or more of said instances of the transformer circuit, provides for a desired capacitance in the transformer-based circuit FIG. 3C illustrates a high frequency structure simulator (HFSS) structure of the transformer-based IQ example, according to embodiments. Similar to IQ unit 320, the HFSS structure 330 receives inputs In+ and In−, and produce outputs I+, I−, Q− and Q+ as illustrated. The structure 330 implements the circuitry of IQ unit 320 using two layers of electrical traces arranged in concentric spirals, with suitable crossings, trace lengths, and trace spacing. The capacitive and inductive couplings illustrated in FIG. 3B are provided for via the configuration and location of these traces.

Referring to FIG. 3B and FIG. 3C, in some embodiments, the phase/amplitude mismatch is highly suppressed by cascading multiple stages of transformer-based 90 degree hybrid coupler units. In other words, the first stage and the second stage are cascaded to suppress mismatch in one or both of: amplitude characteristics; and non-orthogonality in phase characteristics, of the in-phase differential LO signal and the quadrature differential LO signal. The two-stage transformer-based IQ may achieve high-accuracy IQ generation over 20-50 GHz as further illustrated with reference to FIG. 5C.

In some embodiments, the required capacitors in the transformer couplers (FIG. 3B) are realized by co-designing the coupling of the transformer and their connecting traces. These effective capacitors are defined by lithograph of top metal layers and thus are can be captured in the 3D EM simulations by HFSS 330 as illustrated in FIG. 3C. Compared to using physical capacitors, absorbing them into the transformer-based IQ generation network 300 can be more robust against device process variations. The impedance transformation may be sequentially up-scaled by cascading these two stages with a coupling factor ("K") of 0.6~0.7 to achieve overall ten times (10×) impedance ratio in embodiments described herein. The coupling factor, K, refers to the coupling factor in the transformer (coupling between the first winding and the second winding of the first and second transformers in FIG. 3B). In addition, if there is a mismatch, the reflection wave will be terminated at the isolation ports. The embodiment illustrated in FIG. 3A can provide for cascaded multistage isolation ports for buffering the mismatches.

In some embodiments, the PPF 112 and the IQ generation network 300 may be cooperatively configured to facilitate wideband image rejection. The PPF 112 and the IQ generation network 300 may be cooperatively configured to facilitate wideband image rejection by configuring the PPF to generate the in-phase differential IF signal and the quadrature differential IF signal to have matched amplitude characteristics and orthogonal phase characteristics over a wide frequency band. The PPF 112 and the IQ generation network 300 may further be cooperatively configured to facilitate wideband image rejection by configuring the transformer-based circuit to generate the in-phase differential LO signal and the quadrature differential LO signal to have matched amplitude characteristics and orthogonal phase characteristics over said wide frequency band.

FIG. 4 illustrates a schematic of the double balanced differential IQ up-conversion mixer, according to embodiments. The double balanced differential IQ up-conversion mixer 400, or simply IQ mixer 400 may be similar to the up-conversion IQ mixer 108. The IQ mixer 400 may comprise a Q-signal mixer 410 portion for receiving LO_I+ and LO_I− and a I-signal Mixer portion 420 for receiving LO_Q+ and LO_Q− as illustrated.

A mixer, for example, mixers 111 and 113, may be a three port device that can perform a frequency conversion or modulation of a signal. According to embodiments, for a transmitter, a mixer may up convert an IF signal using an LO signal to generate a mm-Wave frequency. The mixers can be balanced Gilbert mixers for up-converting a differential IF signal using differential LO signals to generate differential mm-wave frequency signals. The mixers may be configured generally as follows. Two transistors are gate driven in a differential manner with a differential in-phase (or quadrature) IF signal, obtained for example from the PPF output, possibly after additional amplification. Each of these two transistors are coupled, gate-to-drain, to two further respective transistors. The further respective transistors are driven in a differential manner with a differential quadrature (or in-phase) LO signal, obtained for example from the IQ LO generator circuit described above. The signal at the gate or drain terminals of the further respective transistors are provided as the differential RF signals.

Referring to FIG. 4, the Q-signal mixer 410 portion may correspond to a first gilbert mixer 113 for receiving the differential quadrature IF signals (IF_Q+ and IF_Q−) from the IF drivers 110 and the differential in-phase local oscillator signal (LO_I+ and LO_I−) from the LO within the IQ generation network 300. The I-signal Mixer portion 420 may correspond to a second gilbert mixer 111 for receiving the in-phase IF signals (IF_I+ and IF_I−) from the IF drivers 110 and the differential local oscillator quadrature signals (LO_Q+, and LO_Q−) from the LO within the IQ generation network 300. That is, the mixers 410 and 420 are detailed representations of the mixers 113 and 111, respectively.

A person skilled in the art may appreciate that the impedance at the transistors' gate of the LO ports in the mixers 400 is typically very high, which may be practically equivalent to nearly an open circuit. Even at such high impedance, the transformer-based IQ generation network 300 discussed herein can be capable of preserving a high-precision IQ generation.

The mixer 400 and the transformer based IQ network 300 may be co-designed. The transistor gate capacitors $C_{par}$ at LO_I+, LO_I−, LO_Q+, LO_Q− can be resonated out by co-designing the transformer-based IQ generation network 300.

In some embodiments, the IQ mixer 400 may be configured to facilitate wideband image rejection by providing a high input impedance to support the PPF and the transformer-based circuit in providing outputs having matched amplitude characteristics and orthogonal phase characteristics over a wide frequency band.

Figure 5A:
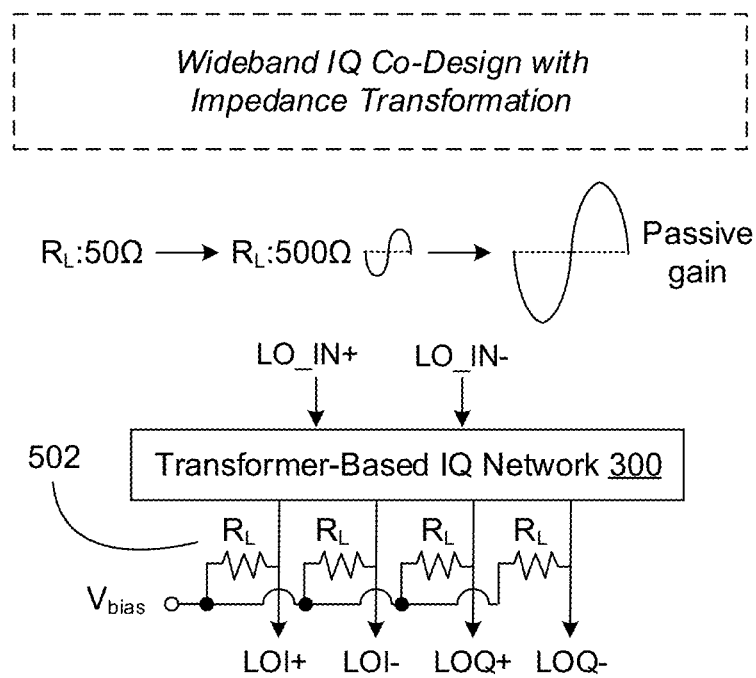
FIG. 5A illustrates a diagram of the IQ network with an external parallel impedance, according to embodiments.

FIG. 5A illustrates a diagram of the IQ network 300 with an external parallel impedance, according to embodiments. The transformer-based IQ generator 300, which may also be referred to as a transformer-based IQ network, may include a positive LO_I (LO_I+) port to produce an LOI+ signal and a negative LOI (LO_I−) port to produce an LOI− signal based on LO input signals LO_IN+ and LO_IN− generated from a LO within the IQ generation network 300. The LOI+ and LOI− signals represent a differential in-phase signal. The transformer-based IQ generator 300 may further include a positive LOQ (LOQ+) port to produce an LOQ+ signal, and a negative LOQ (LOQ−) port to produce an LOQ− signal. The LOQ+ and LOQ− signals represent a differential quadrature signal. The output signals LOI+, LOI−, LOQ+, and LOQ− are provided to inputs of mixers 111 and 113 respectively.

Referring to FIG. 5A, each of the differential LOI and LOQ signals from the IQ network 300 (e.g., LOI+, LOI−, LOQ+, or LOQ− signals) may be coupled to a load resistor ($R_L$). Each of the load resistors may couple each of the differential LOI and LOQ signals to a predetermined bias voltage. By connecting a load resister to an output terminal of transformer-based IQ generator 300, the output impedance can be increased, which in turn increases the voltage applied to an input of a mixer 108 (or mixers 111 and 113). The higher input voltage will lead to a higher conversion gain of the mixer. The $R_L$ 502 is a parallel impedance added externally at the gate of the LO ports to reduce loaded Q. As illustrated, increasing the $R_L$ 502 from 50Ω to 500Ω can result in a passive gain amplification. The passive gain due to change in impedance of $R_L$ 502 may be further illustrated in FIG. 5B.

Figure 5B:
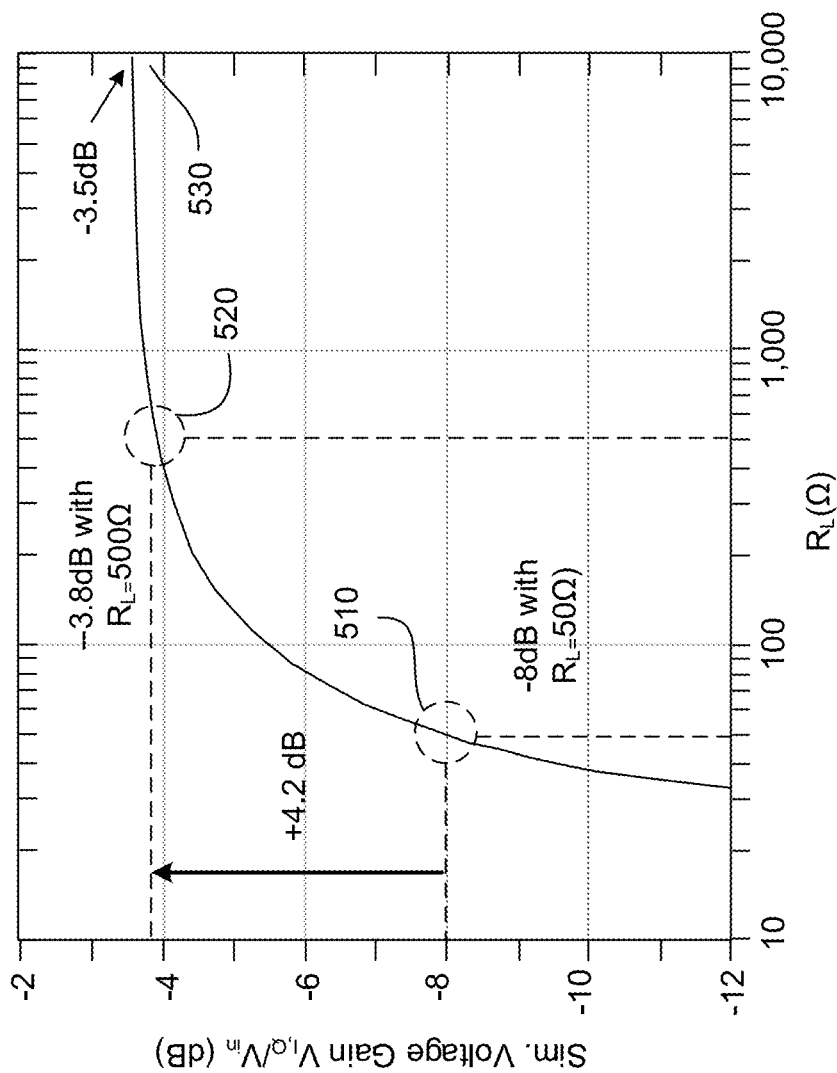
FIG. 5B illustrates passive gain amplification as a function of $R_L$, according to embodiments.

FIG. 5B illustrates the passive gain amplification as a function of $R_L$, according to embodiments. The passive voltage gain of the two-stage transformer IQ generation network 300 versus different loads ($R_L$), as shown in FIG. 5B, can display the potential passive gain achievable by varying the $R_L$ 502. The passive gain amplification at 510 ($R_L$ at 50Ω) may be −8 dB as illustrated. The passive gain at 520 ($R_L$ at 500Ω) may be −3.8 dB, and the passive gain amplification at 530 ($R_L$ at 10,000Ω) may be −3.5 dB. Changing the $R_L$ from 50Ω to 500Ω, from 510 to 520 respectively, provides for a gain of +4.2 dB as illustrated. Referring to FIG. 5B, at 35 GHz, the simulated passive voltage gain of the proposed IQ network 300 can be largely improved from −8 dB for standard 50Ω loads at 510 to −3.5 dB at 10 KΩ load at 530, showing a +4.5 dB gain enhancement. For mixer LO port loads of $R_L$~500Ω, the achieved passive voltage gain can be −4 dB with 4 dB enhancement as illustrated.

The low-loss IQ generation network 300 also can realize impedance up-scaling from its 50Ω input to 500Ω load at the IQ mixer LO ports, which allows for a large passive voltage amplification of the LO waveforms to be achieved for large LO voltage swing requirement of the mixer 400 at mm-Wave.

Figure 5C:
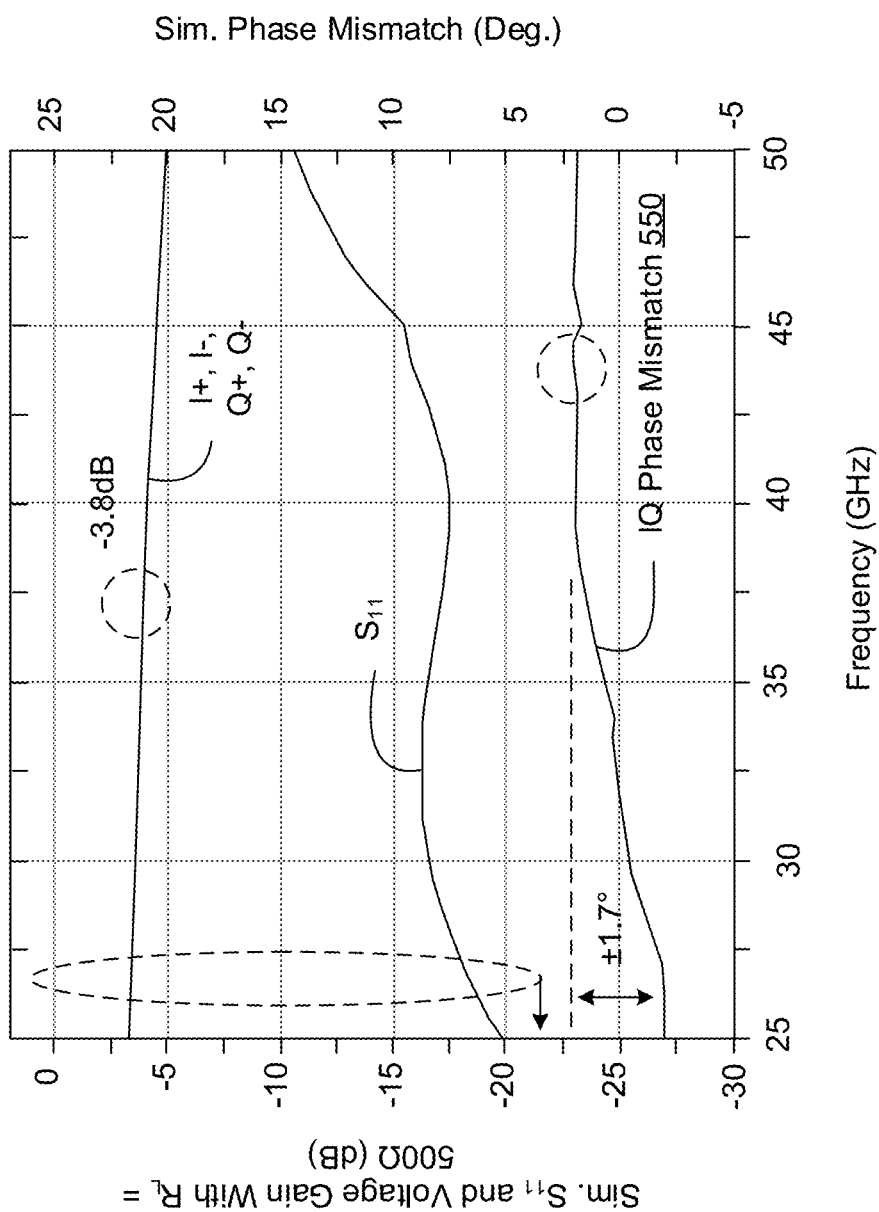
FIG. 5C illustrates a simulation result for the IQ generation network, the mixer, and the $R_L$ at 500Ω, according to embodiments.

FIG. 5C illustrates a simulation result for the IQ generation network, the mixer, and the $R_L$ at 500Ω, according to embodiments. FIG. 5C illustrates the results of integrating the IQ generation network 300 with the mixer 400 and the $R_L$ at 500Ω for achieving passive voltage amplification. It should be noted that considering the inherent 6 dB 1-to-4 power splitting loss, the transformer IQ generation network 300 can achieve a passive voltage amplification gain of 2.2 dB without external control/tuning elements, which enhances the mixer conversion gain that is highly dependent on LO swing (FIG. 5C). Further, the output accuracy of the transformer IQ generation network 300 is further illustrated by the small range of IQ phase match 550, a range of ±1.7° for the range of 25 to 50 GHz as illustrated in FIG. 5C.

Figure 6:
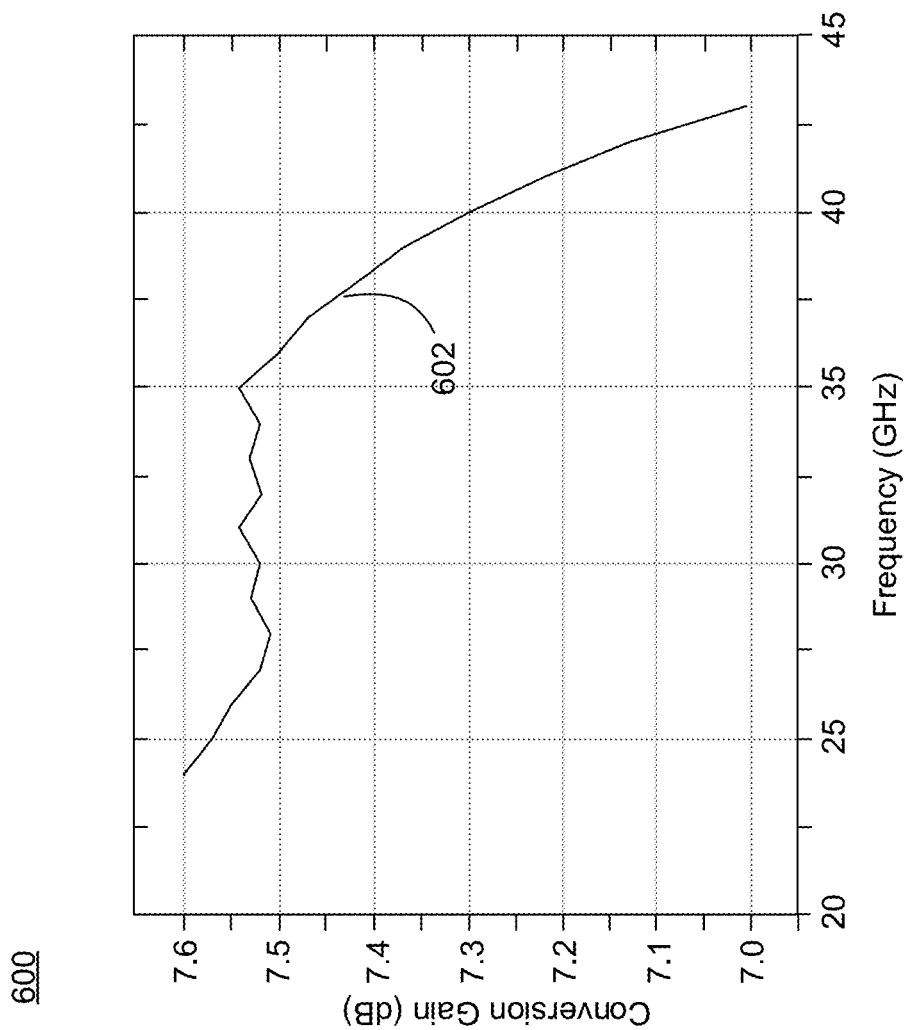
FIG. 6 illustrates the conversion gain of the IQ mixer as a function of LO frequency, according to embodiments.

FIG. 6 illustrates the conversion gain of the IQ mixer as a function of LO frequency, according to embodiments. The graph 600 illustrates the change in IQ mixer 400 conversion gain 602 for different LO frequency. Referring to FIG. 6, with only a moderate −2 dBm differential power at the input of the LO IQ generation, the IQ mixer 400 can yield an up-conversion gain of greater than 7 dB and amplitude mismatch <0.7 dB over 23G to 43 GHz. The output load inductor 402, 404 of the IQ mixer 400 can be co-designed with the input capacitors of the following driver 104 and amplifier 102 stage to form a first-order band pass filter to create a LO signal and suppress harmonic signals from the mixer 400 during the conversion.

In some embodiments, the transformer-based circuit 300 may be configured to have capacitance and impedance characteristics which operate, through resonance, to mitigate one or more parasitic capacitances produced by one or more transistors present in the IQ mixer 400.

Figure 7:
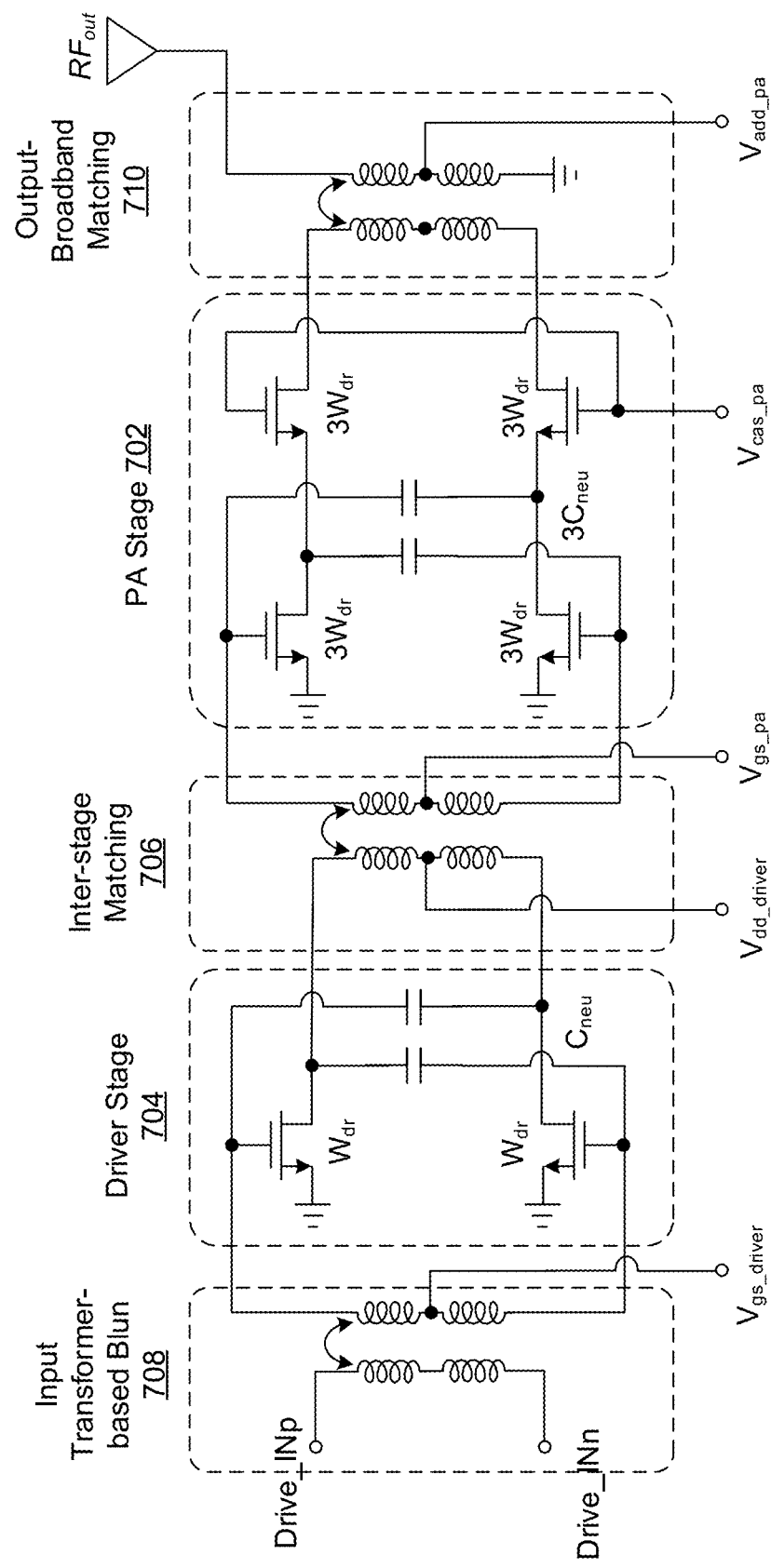
FIG. 7 illustrates a wideband power amplifier (PA) and driver stage, according to embodiments.

FIG. 7 illustrates a generic wideband power amplifier (PA) and driver stage, according to embodiments. The driver stage 704 may refer to driver 104 as described elsewhere herein. Similarly, the PA stage 702 may refer to the PA 102 as described elsewhere herein. The proposed generic wide band PA and driver stage of FIG. 7 further comprises an input transformer based blun 708, an inter-stage matching portion 706 between the driver stage 704 and PA stage 702, and an output matching portion 710 as illustrated. The matching portions 706, 708, 710 can comprise differentially driven transformers, which may be provided as center taps with driver signals. The center tap provides common mode DC voltage for transition biasing. Moreover, the RF differential signal will not affect the common-mode biasing due to virtual grounding at the center taps.

In some embodiments, for the PA 702 in FIG. 7, to maximize the Pout and PAE from a given power device, the PA can require an optimum load impedance which can be approximated as:

$$Z_{opt} = R_{opt} \| \left( \frac{-1}{j\omega C_{dev}} \right);$$

where: the $R_{opt}$ is the targeted optimum resistive load determined by the device load-line condition and $C_{dev}$ is the device output capacitance under large signal driving.

In some embodiments, the load-pull condition demands an output matching network to transform the 50Ω load ($R_L$ 502) to $Z_{opt}$ over the entire target frequency range for the PA, which can be extensively facilitated by transformers.

According to embodiment, the design can provide a differential signal for the PA and driver stages. The differential signal can allow for cancelling out the common mode signals. In some embodiments, the driver stage 704 may be a common source and the PA stage 702 may be cascaded common sources. The cascaded design of the PA stage 702 provides for a further increase in the voltage swing in the last stage with maximum output power.

In the illustrated driver and PA design, the size ratio of the PA stage transistor to the driver stage transistor is 3:1. In other words, the driver stage 704 may comprise a first set of transistors have a first gate width, and the PA stage 702 may have a second set of transistors having a second gate width which may be three times the first gate width. The transistor ratio employed in the PA and driver design can enhance the efficiency in terms of energy consumption of the design. Further, the use of single common source for the driver stage further enhances the efficiency of the overall design. Similar to the transistor ratio of the PA stage to the driver stage, the neutralization capacitor ratio of the PA stage to the driver stage may also be a 3:1 ratio as illustrated. The 3:1 transistor size ratio facilitates the 3:1 neutralization capacitor ratio by substantially cancelling out the parasitic capacitance due to the neutralization capacitors, which provides a better PA efficiency and extended bandwidth operation at mm-Wave. The neutralization capacitors may be external capacitors used for cancelling out parasitic capacitance, and may be coupled between the gate of one transistor and the drain of another transistor, as shown.

It will be appreciated that, although specific embodiments of the technology have been described herein for purposes of illustration, various modifications may be made without departing from the scope of the technology. The specification and drawings are, accordingly, to be regarded simply as an illustration of the invention as defined by the appended claims, and are contemplated to cover any and all modifications, variations, combinations or equivalents that fall within the scope of the present invention. In particular, it is within the scope of the technology to provide a computer program product or program element, or a program storage or memory device such as a magnetic or optical wire, tape or disc, or the like, for storing signals readable by a machine, for controlling the operation of a computer according to the method of the technology and/or to structure some or all of its components in accordance with the system of the technology.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A wireless transmitter comprising:
a poly phase filter (PPF) configured to receive an input differential intermediate frequency (IF) signal and to generate an in-phase differential IF signal and a quadrature differential IF signal;
a transformer-based circuit configured to receive an input differential local oscillator (LO) signal and to generate an in-phase differential LO signal and a quadrature differential LO signal based on the input differential LO signal;
a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component, the mixer further configured to provide a differential RF signal comprising a (filtered or unfiltered) combination of the first RF signal component and the second RF signal component;
an amplification stage configured to amplify the differential RF signal, the amplification stage comprising a driver stage and a power amplifier stage; and
one or more of: a first transformer circuit interposed between an output of the mixer and an input of the driver stage; a second transformer circuit interposed between an output of the driver stage and an input of the power amplifier stage; and a third transformer circuit interposed between an output of the power amplifier stage and a subsequent antenna stage.

2. The wireless transmitter of claim 1, wherein the PPF comprises a resistive-capacitive capacitive-resistive network.

3. The wireless transmitter of claim 1, wherein the PPF and the transformer-based circuit are cooperatively configured to facilitate wideband image rejection by:
configuring the PPF to generate the in-phase differential IF signal and the quadrature differential IF signal to have matched amplitude characteristics and orthogonal phase characteristics over a wide frequency band; and
configuring the transformer-based circuit to generate the in-phase differential LO signal and the quadrature differential LO signal to have matched amplitude characteristics and orthogonal phase characteristics over said wide frequency band.

4. The wireless transmitter of claim 3, wherein the mixer is further configured to facilitate wideband image rejection by providing a high input impedance to support the PPF and the transformer-based circuit in providing outputs having matched amplitude characteristics and orthogonal phase characteristics over said wide frequency band.

5. The wireless transmitter of claim 1, wherein the transformer-based circuit is configured to have capacitance and impedance characteristics which operate, through resonance, to mitigate one or more parasitic capacitances produced by one or more transistors present in the mixer.

6. The wireless transmitter of claim 1, wherein the mixer comprises a first mixer portion configured to multiplicatively mix the in-phase differential IF signal with the quadrature differential LO signal to produce the first RF signal component and a second mixer portion operating in parallel with the first mixer portion and configured to multiplicatively mix the quadrature differential IF signal with the in-phase differential LO signal to produce the second RF signal component, and wherein each of the first mixer portion and the second mixer portion comprises a set of transistors arranged in a source-to-drain configuration with gates of the transistors configured to receive the in-phase differential IF signal, the quadrature differential LO signal, the quadrature differential IF signal, and the in-phase differential LO signal, respectively.

7. The wireless transmitter of claim 1, wherein the driver stage comprises a common source amplifier.

8. The wireless transmitter of claim 7, wherein the power amplifier stage comprises a cascade amplifier.

9. A wireless transmitter comprising:
a first stage comprising:
   a poly phase filter (PPF) configured to receive an input differential intermediate frequency (IF) signal and to generate an in-phase differential IF signal and a quadrature differential IF signal;
   a transformer-based circuit configured to receive an input differential local oscillator (LO) signal and to generate an in-phase differential LO signal and a quadrature differential LO signal based on the input differential LO signal;
   a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component, the mixer further configured to provide a differential RF signal comprising a (filtered or unfiltered) combination of the first RF signal component and the second RF signal component;
   an amplification stage configured to amplify the differential RF signal, the amplification stage comprising a driver stage and a power amplifier stage;
   a first pair of inputs and a first pair of branches, wherein each of the first pair of branches includes, in series: a first capacitor, a first resistor, a second capacitor and a second resistor, and wherein each of the first pair of branches is coupled at its ends to the first pair of inputs;
   a first pair of outputs provided at a junction between the first capacitors and the first resistors; and
   a second pair of outputs provided at a junction between the second capacitors and the second resistors; and
a second stage comprising:
   a second pair of inputs and a second pair of branches, wherein each of the second pair of branches includes, in series: a first further capacitor, a first further resistor, a second further capacitor and a second further resistor, and wherein each of the second pair of branches is coupled at its ends to the second pair of inputs;
   a third pair of inputs provided at a junction between the first further resistors and the second further capacitors;
   a third pair of outputs provided at a junction between the first further capacitors and the first further resistors; and
   a fourth pair of outputs provided at a junction between the second further capacitors and the second further resistors,
   wherein the first pair of outputs is coupled to the third pair of inputs, and the second pair of outputs is coupled to the second pair of inputs.

10. A wireless transmitter comprising:
a poly phase filter (PPF) configured to receive an input differential intermediate frequency (IF) signal and to generate an in-phase differential IF signal and a quadrature differential IF signal;
a transformer-based circuit configured to receive an input differential local oscillator (LO) signal and to generate an in-phase differential LO signal and a quadrature differential LO signal based on the input differential LO signal;
a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component, the mixer further configured to provide a differential RF signal comprising a (filtered or unfiltered) combination of the first RF signal component and the second RF signal component; and
an amplification stage configured to amplify the differential RF signal, the amplification stage comprising a driver stage and a power amplifier stage,
wherein the transformer-based circuit comprises a first stage and a second stage, the first stage comprising a first instance of a transformer circuit receiving the differential input LO signal, the second stage comprising a second instance and a third instance of the transformer circuit, wherein output of the first stage is provided to the second stage, and wherein the second instance and the third instance are cross-coupled and configured to provide the in-phase differential LO signal and the quadrature differential LO signal.

11. The wireless transmitter of claim 10, wherein each instance of the transformer circuit comprises a pair of transformers each having four ports, with one of the four ports being grounded through a resistor, and each other one of the four ports being coupled to an input of the transformer-based circuit, an output of the transformer-based circuit, or another port of another instance of the transformer circuit.

12. The wireless transmitter of claim 10, wherein the transformer-based circuit is provided using plural layers of electrical traces arranged in concentric spirals.

13. The wireless transmitter of claim 10, wherein the transformer-based circuit is configured to provide a passive voltage gain.

14. The wireless transmitter of claim 10, wherein the transformer-based circuit is configured to facilitate wideband image rejection by generating the in-phase differential LO signal and the quadrature differential LO signal to have matched amplitude characteristics and orthogonal phase characteristics over a wide frequency band.

15. The wireless transmitter of claim 10, wherein the first stage and the second stage are cascaded to suppress mismatch in one or both of: amplitude characteristics; and non-orthogonality in phase characteristics, of the in-phase differential LO signal and the quadrature differential LO signal.

16. The wireless transmitter of claim 10, wherein at least one electrical connection between instances of the transformer circuit is configured to provide a capacitance which, together with a capacitance of one or more of said instances of the transformer circuit, provides for a desired capacitance in the transformer-based circuit.

17. A wireless transmitter comprising:
a poly phase filter (PPF) configured to receive an input differential intermediate frequency (IF) signal and to generate an in-phase differential IF signal and a quadrature differential IF signal;
a transformer-based circuit configured to receive an input differential local oscillator (LO) signal and to generate an in-phase differential LO signal and a quadrature differential LO signal based on the input differential LO signal;
a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component, the mixer further configured to provide a differential RF signal comprising a (filtered or unfiltered) combination of the first RF signal component and the second RF signal component; and
an amplification stage configured to amplify the differential RF signal, the amplification stage comprising a driver stage and a power amplifier stage,
wherein the driver stage comprises a first set of neutralization capacitors each having a first capacitance, and the power amplifier stage comprises a second set of neutralization capacitors having a second capacitance which is three times the first capacitance, and wherein the driver stage comprises a first set of transistors having a first gate width, and the power amplifier stage comprises a second set of transistors having a second gate width which is three times the first gate width.

18. A wireless transmitter comprising:
a poly phase filter (PPF) configured to receive an input differential intermediate frequency (IF) signal and to generate an in-phase differential IF signal and a quadrature differential IF signal;
a transformer-based circuit configured to receive an input differential local oscillator (LO) signal and to generate an in-phase differential LO signal and a quadrature differential LO signal based on the input differential LO signal;
a mixer configured to multiplicatively mix the in-phase differential IF signal with the quadrature differential LO signal to produce a first RF signal component and to multiplicatively mix the quadrature differential IF signal with the in-phase differential LO signal to produce a second RF signal component, the mixer further configured to provide a differential RF signal comprising a (filtered or unfiltered) combination of the first RF signal component and the second RF signal component; and
an amplification stage configured to amplify the differential RF signal, the amplification stage comprising a driver stage and a power amplifier stage,
wherein the mixer comprises an output load inductor which is cooperatively configured with input capacitances of the one or both of the driver stage and the power amplifier stage to form one or more band pass filters, said band pass filters configured to suppress harmonic signals from the mixer.

* * * * *